United States Patent
King (10) Patent No.: US 6,990,016 B2
(45) Date of Patent: Jan. 24, 2006

(54) METHOD OF MAKING MEMORY CELL UTILIZING NEGATIVE DIFFERENTIAL RESISTANCE DEVICES

(75) Inventor: Tsu-Jae King, Fremont, CA (US)

(73) Assignee: Progressant Technologies, Inc., Mountain View, CA (US)

( * ) Notice: Subject to any disclaimer, the term of this patent is extended or adjusted under 35 U.S.C. 154(b) by 209 days.

(21) Appl. No.: 10/884,574

(22) Filed: Jul. 2, 2004

(65) Prior Publication Data
US 2004/0246764 A1 Dec. 9, 2004

Related U.S. Application Data

(62) Division of application No. 10/185,568, filed on Jun. 28, 2002, now Pat. No. 6,795,337.

(51) Int. Cl.
*G11C 11/34* (2006.01)

(52) U.S. Cl. .................................... 365/176; 365/177
(58) Field of Classification Search ............... 365/177, 365/176, 159, 189.09, 200, 202; 438/200, 438/238
See application file for complete search history.

(56) References Cited

U.S. PATENT DOCUMENTS

| | | |
|---|---|---|
| 3,588,736 A | 6/1971 | McGroddy |
| 3,903,542 A | 9/1975 | Nathanson et al. |
| 3,974,486 A | 8/1976 | Curtis et al. |
| 4,047,974 A | 9/1977 | Harari |
| 4,143,393 A | 3/1979 | DiMaria et al. |
| 4,503,521 A | 3/1985 | Schick et al. |
| 4,644,386 A | 2/1987 | Nishizawa |
| 4,806,998 A | 2/1989 | Vinter et al. |
| 4,945,393 A | 7/1990 | Beltram et al. |
| 5,021,841 A | 6/1991 | Leburton et al. |
| 5,023,836 A | 6/1991 | Mori |
| 5,032,891 A | 7/1991 | Takagi et al. |
| 5,084,743 A | 1/1992 | Mishra et al. |
| 5,093,699 A | 3/1992 | Weichold et al. |
| 5,130,763 A | 7/1992 | Delhaye et al. |
| 5,162,880 A | 11/1992 | Hazama |
| 5,189,499 A | 2/1993 | Izumi et al. |
| 5,294,566 A * | 3/1994 | Mori .......................... 438/170 |
| 5,311,465 A | 5/1994 | Mori et al. |
| 5,357,134 A | 10/1994 | Shimoji |
| 5,390,145 A | 2/1995 | Nakasha et al. |
| 5,442,194 A | 8/1995 | Moise |
| 5,448,513 A | 9/1995 | Hu et al. |

(Continued)

FOREIGN PATENT DOCUMENTS

| | | |
|---|---|---|
| EP | 0747940 | 12/1996 |
| EP | 0747961 | 12/1996 |

(Continued)

OTHER PUBLICATIONS

Final Report: SMILE MEL–ARI Project n° 28741—Chapter V, pp. 184–194.

(Continued)

*Primary Examiner*—David Nelms
*Assistant Examiner*—Thinh T Nguyen
(74) *Attorney, Agent, or Firm*—Bever, Hoffman & Harms, LLP; Jeanette S. Harms (57) ABSTRACT

A two terminal, silicon based negative differential resistance (NDR) element is disclosed, to effectuate of NDR diode for selected applications. The two terminal device is based on a three terminal NDR-capable FET which has a modified channel doping profile, and in which the gate is tied to the drain. This device can be integrated through conventional CMOS processing with other NDR and non-NDR elements, including NDR capable FETs. A memory cell using such NDR two terminal element and an NDR three terminal is also disclosed.

13 Claims, 2 Drawing Sheets

U.S. PATENT DOCUMENTS

| | | |
|---|---|---|
| 5,455,432 A | 10/1995 | Hartsell et al. |
| 5,463,234 A | 10/1995 | Toriumi et al. |
| 5,477,169 A | 12/1995 | Shen et al. |
| 5,523,603 A | 6/1996 | Fishbein et al. |
| 5,543,652 A | 8/1996 | Ikeda et al. |
| 5,552,622 A | 9/1996 | Kimura |
| 5,606,177 A | 2/1997 | Wallace et al. |
| 5,608,250 A | 3/1997 | Kalnitsky |
| 5,633,178 A | 5/1997 | Kalnitsky |
| 5,689,458 A | 11/1997 | Kuriyama |
| 5,698,997 A | 12/1997 | Williamson, III et al. |
| 5,705,827 A | 1/1998 | Baba et al. |
| 5,732,014 A | 3/1998 | Forbes |
| 5,761,114 A | 6/1998 | Bertin et al. |
| 5,770,958 A | 6/1998 | Arai et al. |
| 5,798,965 A | 8/1998 | Jun |
| 5,804,475 A | 9/1998 | Meyer et al. |
| 5,843,812 A | 12/1998 | Hwang |
| 5,869,845 A | 2/1999 | Van der Wagt et al. |
| 5,883,549 A | 3/1999 | De Los Santos |
| 5,883,829 A | 3/1999 | Van der Wagt |
| 5,895,934 A | 4/1999 | Harvey et al. |
| 5,903,170 A | 5/1999 | Kulkarni et al. |
| 5,907,159 A | 5/1999 | Roh et al. |
| 5,936,265 A | 8/1999 | Koga |
| 5,945,706 A | 8/1999 | Jun |
| 5,953,249 A | 9/1999 | van der Wagt |
| 5,959,328 A | 9/1999 | Krautschneider et al. |
| 5,962,864 A | 10/1999 | Leadbeater et al. |
| 6,015,739 A | 1/2000 | Gardner et al. |
| 6,015,978 A | 1/2000 | Yuki et al. |
| 6,075,265 A | 6/2000 | Goebel et al. |
| 6,077,760 A | 6/2000 | Fang et al. |
| 6,084,796 A | 7/2000 | Kozicki et al. |
| 6,091,077 A | 7/2000 | Morita et al. |
| 6,097,036 A | 8/2000 | Teshima et al. |
| 6,104,631 A | 8/2000 | El-Sharawy et al. |
| 6,128,216 A | 10/2000 | Noble, Jr. et al. |
| 6,130,559 A | 10/2000 | Balsara et al. |
| 6,150,242 A | 11/2000 | Van der Wagt et al. |
| 6,184,539 B1 | 2/2001 | Wu et al. |
| 6,205,054 B1 | 3/2001 | Inami |
| 6,222,766 B1 | 4/2001 | Sasaki et al. |
| 6,225,165 B1 | 5/2001 | Noble, Jr. et al. |
| 6,243,300 B1 | 6/2001 | Sunkavalli |
| 6,246,606 B1 | 6/2001 | Forbes et al. |
| 6,261,896 B1 | 7/2001 | Jun |
| 6,294,412 B1 | 9/2001 | Krivokapic |
| 6,301,147 B1 | 10/2001 | El-Sharawy et al. |
| 6,303,942 B1 | 10/2001 | Farmer |
| 6,310,799 B2 | 10/2001 | Duane et al. |
| 6,396,731 B1 | 5/2002 | Chou |
| 6,404,018 B1 | 6/2002 | Wu et al. |
| 6,424,174 B1 | 7/2002 | Nowak et al. |
| 6,795,337 B2 | 9/2004 | King |
| 2001/0005327 A1 | 6/2001 | Duane et al. |
| 2001/0013621 A1 | 8/2001 | Nakazato |
| 2001/0019137 A1 | 9/2001 | Koga et al. |
| 2001/0024841 A1 | 9/2001 | Noble Jr. et al. |
| 2001/0053568 A1 | 12/2001 | Deboy et al. |
| 2002/0017681 A1 | 2/2002 | Inoue |
| 2002/0048190 A1 | 4/2002 | King |
| 2002/0054502 A1 | 5/2002 | King |
| 2002/0057123 A1 | 5/2002 | King |
| 2002/0063277 A1 | 5/2002 | Ramsbey |
| 2002/0066933 A1 | 6/2002 | King |
| 2002/0067651 A1 | 6/2002 | King |
| 2002/0076850 A1 | 6/2002 | Sadd et al. |
| 2002/0093030 A1 | 7/2002 | Hsu et al. |
| 2002/0096723 A1 | 7/2002 | Awaka |
| 2002/0100918 A1 | 8/2002 | Hsu et al. |
| 2002/0109150 A1 | 8/2002 | Kajiyama |

FOREIGN PATENT DOCUMENTS

| | | |
|---|---|---|
| EP | 0655788 | 1/1998 |
| EP | 1050964 | 11/2000 |
| EP | 1168456 | 1/2001 |
| EP | 1085656 | 3/2001 |
| EP | 1107317 | 6/2001 |
| EP | 0526897 | 11/2001 |
| EP | 1204146 | 5/2002 |
| JP | 8018033 | 1/1996 |
| JP | 20011015757 | 1/2001 |
| WO | WO 99/63598 | 4/1999 |
| WO | WO 00/41309 | 7/2000 |
| WO | WO 01/65597 | 9/2001 |
| WO | WO 01/69607 | 9/2001 |
| WO | WO 01/88977 | 11/2001 |
| WO | WO 01/99153 | 12/2001 |

OTHER PUBLICATIONS

News Release from www.eurekalert.org/releases/udel-udc-nfib.html, " UD Computer News: Future Looks Bright for Tunnel Diodes, Promising Faster, More Efficient Circuits," Oct. 1, 1998, 4 pages.

P.S. Barlow, et al., "Negative differential output conductance of self-heated power MOSFETs," IEE Proceedings-I Solid-State and Electron Devices, vol. 133, Part I, No. 5, Oct. 1986, pp. 177-179.

E. Chan, et al., "Compact Multiple-Valued Multiplexers Using Negative Differential Resistance Devices," IEEE Journal of Solid-State Circuits, vol. 31, No. 8, Aug. 1996, pp. 1151-1156.

E. Chan, et al., "Mask Programmable Multi-Valued Logic Gate Arrays Using RTDs and HBTs," IEE Proceedings-E: Computers and Digital Techniques, vol. 143, No. 5, Oct. 1996, pp. 289-294.

Deen, Jamal (editor) et al., excerpt from "CMOS RF modeling, characterization and applications," World Scientific, Apr. 2002, 34 pages.

Dozsa, L. et al., "A transient method for measuring current-voltage characteristics with negative differential resistance regions," Research Institute for Technical Physics, P. O. Box 76, H-1325 Budapest, Hungary, (Received Jul. 24, 1997); accepted Aug. 1, 1997), 2 pages.

Gardner, Carl, Ringhofer, Christian, "Smooth Quantum Hydrodynamic Model Simulation of the Resonant Tunneling Diode," Dept. Of Mathematics Arizona State University, pp. 1-5, (1998).

Geppert, Linda "Quantum transistors: toward nanoelectronics," IEEE Spectrum, Sep. 2000, pp. 46-51.

Goldhaber-Gordon, David et al., "Overview of nanoelectronic devices," Proc. IEEE, 85(4), Apr. 1997, pp. 521-540.

Alejandro F. Gonzalez, et al., "Standard CMOS Implementation of a Multiple-Valued Logic Signed-Digit Adder Based on Negative Differential-Resistance Devices," Proceedings of the 30th IEEE International Symposium on Multiple-Valued Logic (ISMVL 2000), 6 pages.

Haddab, Y. et al., "Quantized current jumps in silicon photoconductors at room temperature," J. Appl. Phys. 86 (7), Oct. 1, 1999, pp. 3787-3791.

G. I. Haddad et al., "Tunneling Devices and Applications in High Functionality/Speed Digital Circuits," Solid State Electronics, vol. 41, No. 10, Oct. 1997, pp. 1515-1524.

Hansch, W. et al., "The planar–doped–barrier–FET: MOSFET overcomes conventional limitations," ESSDERC'97 27th European Solid–State Device Research Conference, Stuttgart, Sep. 22–24, 1997, 4 pages.

C. P. Heij, et al., "Negative Differential Resistance Due to Single–Electron Switching," Applied Physics Letters, vol. 74, No. 7, Feb. 15, 1999, 5 pages.

Hong, J.W. et al., "Local charge trapping and detection of trapped charge by scanning capacitance microscope in SiO2/Si system," Appl. Phys. Lett., 75 (12), Sep. 20, 1999, pp. 1760–1762.

Jungel, A, Pohl, C., "Numerical Simulation of Semiconductor Devices: Energy–Transport and Quantum Hydrodynamic Modeling," Fachbereich Math., Tech. Univ. Berlin, Germany, pp. 1–9, 1998.

Karna, Shashi P. et al., "Point defects in Si–SiO2 systems: current understanding," Published in G. Pacchioni et al. (eds), "Defects in SiO2 and related dielectrics: science and technology," Kluwer Academic Publishers, p. 599–615, (2000), 19 pages.

King, Tsu–Jae et al., U.S. Appl. No. 09/602,658, entitled "CMOS Compatible Process for Making a Tunable Negative Differential Resistance (NDR) Device," filed Jun. 22, 2000, 33 pages.

King, Tsu–Jae et al., U.S. Appl. No. 09/603,101, entitled "CMOS–Process Compatible, Tunable NDR (Negative Differential Resistance) Device and Method of Operating Same," filed Jun. 22, 2000, 34 pages.

King, Tsu–Jae et al., U.S. Appl. No. 09/603,102, entitled "Charge Trapping Device and Method for Implementing a Transistor having a Negative Differential Resistance Mode," filed Jun. 22, 2000, 39 pages.

S. J. Koester, et al., "Negative Differential Conductance in Lateral Double–Barrier Transistors Fabricated in Strained Si Quantum Wells," Applied Physics Letters, vol. 70, No. 18, May, 1997, pp. 2422–2424.

O. Le Neel, et al., "Electrical Transient Study of Negative Resistance in SOI MOS Transistors," Electronics Letters, vol. 26, No. 1, pp. 73–74, Jan. 1990.

S. Luryi and M. Mastrapasqua, "Light–emitting Logic Devices based on Real Space Transfer in Complementary InGaAs/InAlAs Heterostructures", in "Negative Differential Resistance and Instabilities in 2D Semiconductors", ed. by N. Balkan, B. K. Ridley, and A. J. Vickers, NATO ASI Series [Physics] B 307, pp. 53–82, Plenum Press (New York 1993).

Serge Luryi and Mark Pinto, "Collector–Controlled States and the Formation of Hot Electron Domains in Real–Space Transfer Transistors," AT&T Bell Laboratories, pp. 1–7, 1992.

Serge Luryi and Mark Pinto, "Collector–Controlled States in Charge Injection Transistors," SPIE–92 Symposium, pp. 1–12, 1992.

R.H. Mathews, et al., "A New RTD–FET Logic Family, "Proceedings of the IEEE, vol. 87, No. 4, pp. 596–605, 1999.

P. Mazumder, et al., "Digital Circuit Applications of Resonant Tunneling Devices," Proceedings of the IEEE, vol. 86, No. 4, pp. 664–686, Apr., 1998.

S. Mohan, et al., "Logic Design Based on Negative Differential Resistance Characteristics of Quantum Electronic Devices," IEE Proceedings–G: Electronic Devices, vol. 140, No. 6, Dec. 1993, pp. 383–391.

S. Mohan, et al., "Ultrafast Pipelined Adders Using Resonant Tunneling Transistors," IEE Electronics Letters, vol. 27, No. 10, May 1991, pp. 830–831.

S. Mohan, et al., "Ultrafast Pipelined Arithmetic Using Quantum Electronic Devices," IEE Proceedings–E: Computers and Digital Techniques, vol. 141, No. 2, Mar. 1994, pp. 104–110.

Farid Nemati et al., "A Novel High Density, Low Voltage SRAM Cell With a Vertical NDR Device," Center for Integrated Systems, Stanford University, CA, (2 pages).

Farid Nemati et al., "A Novel Thyristor–based SRAM Cell (T–RAM) for High–Speed, Low–Voltage, Giga–scale Memories," Center for Integrated Systems, Stanford University, CA, (4 pages).

S.M.A. Nimour, R. Ouasti, N. Zekri, "Effect of Spatially Disordered Barriers on the Band Structure of Finite Superlattices," phys. stat. sol. (b) 1998, 209, No. 2, 311–318.

R. Oberhuber, et al., "Tunnel–Devices with Negative Differential Resistivity Based on Silicon?," Source: Deutsche Forschungsgemeinschaft and Siemens AG, date unknown, 2 pages.

C. Pacha, et al., "Resonant Tunneling Device Logic Circuits," Microelectronics Advanced Research Initiative (MEL–ARI,) Jul. 1998–Jul. 1999, pp. 1–22.

C. Pacha and K. Goser, "Design of Arithmetic Circuits using Resonant Tunneling Diodes and Threshold Logic," Lehrstuhl Bauelemente der Elektrotechnik, Universitat Dortmund, pp. 1–11, Sep. 1997.

S. L. Rommel, et al., "Room Temperature Operation of Epitaxially Grown Si/Si0.5Ge0.5/Si Resonant Interband Tunneling Diodes," Applied Phsyics Letters, vol. 73, No. 15, pp. 2191–2193, 1998.

Scoffield, John H. et al., "Reconciliation of different gate–voltage dependencies of 1/f noise in n–MOS and p–MOS transistors," IEEE Trans. Electron. Dev. 41 (11), 11 pgs.

A. Seabaugh, "Promise of Tunnel Diode Integrated Circuits," Tunnel Diode and CMOS/HBT Integration Workshop, Dec. 9, 1999, Naval Research Laboratory, Washington, DC., 13 pages.

Seabaugh A., Brar B., Broekaert T., Morris F., and Frazier G., "Resonant Tunneling Mixed Signal Circuit Technology," Solid–State Electronics 43:1355–1365, 1999.

Seabaugh, A. et al., "Tunnel–Diode IC," Minneapolis, Oct. 2, 2001, 23 pages.

Shao, Z., Porod, W., Lent, C., & Kirkner, D., "Transmission Zero Engineering in Lateral Double–Barrier Resonant Tunneling Devices," Dept. Of Electrical Engineering, University of Notre Dame, pp. 1–7 (1996).

Shoucair F. et al., "Analysis and Simulation of Simple Transistor Structures Exhibiting Negative Differential Resistance," EECS Department, UC Berkeley, Berkeley CA, (4 pages).

J. P. Sun, et al., "Resonant Tunneling Diodes: Models and Properties," Proceedings of the IEEE, vol. 86, No. 4, Apr. 1998, pp. 641–661.

J. P. A. Van Der Wagt, "Tunneling–Based SRAM," Proceedings of the IEEE, vol. 87, No. 4, pp. 571–595, 1999.

J. P. A. Van Der Wagt, et al., "RTD/HFET Low Standby Power SRAM Gain Cell," Source: Corporate Research Laboratories, Texas Instruments, 1998, 4 pages.

Villa, S. et al., "Application of 1/f noise measurements to the characterization of near–interface oxide states in ULSI n–MOSFET's," Dipartimento di Elettronica e nformazione, Politecnico di Milano (Italy), 7 pages.

Wirth, G. et al., "Periodic transconductance oscillations in sub–100nm MOSFETs," ESSDERC'97 27th European Solid–State Device Research Conference, Stuttgart, Sep. 22–24, 1997, 4 pages.

G. Wirth, et al., "Negative Differential Resistance in Ultrashort Bulk MOSFETs," IECON'99 Conference Proceedings, vol. 1, San Jose, 1999, S. 29–34.

Jian Fu Zhang, "Traps: Detrapping," Wiley Encyclopedia of Electrical and Electronics Engineering Online, Article Posting Date; Dec. 27, 1999, John Wiley & Sons, Inc., 4 Pages.

Jian Fu Zhang, "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 Pages.

Jian Fu Zhang, "Traps: Measurement Techniques," Wiley Encyclopedia of Electrical and Electronics Engineering Online, Article Posting Date: Dec. 27, 1999, John Wiley & Sons, Inc., 5 Pages.

Jian Fu Zhang, "Traps: Origin of Traps," Wiley Encyclopedia of Electrical and Electronics Engineering Online, Article Posting Date: Dec. 27, 1999, John Wiley & sons, Inc., 4 pages.

Jian Fu Zhang, "Traps: Trapping Kinetics," Wiley Encyclopedia of Electrical and Electronics Engineering Online, Article Posting Date: Dec. 27, 1999, John Wiley & Sons, Inc., 2 Pages.

Jian Fu Zhang, "Traps," Wiley Encyclopedia of Electrical and Electronics Engineering Online, Article Posting Date: Dec. 27, 1999, John Wiley & Sons, Inc., 2 Pages.

Zhang, J.F. et al., "A comparative study of the electron trapping and thermal detrapping in SiO2 prepared by plasma and thermal oxidation," J. Appl. Phys. 72 (4), Aug. 15, 1992, pp. 1429–1435.

Zhang, J.F. et al., "A quantitative investigation of electron detrapping in SiO2 under Fowler–Nordheim stress," J. Appl. Phys. 71 (12), Jun. 15, 1992, pp. 5989–5996.

Zhang, J.F. et al., "Electron trap generation in thermally grown SiO2 under Fowler–Nordheim stress," J. Appl. Phys. 71 (2), Jan. 15, 1992, pp. 725–734.

* cited by examiner

Fig. 3 ns. E. Goto in *IRE trans. Electronic Computers*, March 1960, p. 25 disclosed an SRAM cell consisting of two resonant tunneling diodes (RTDs) and a pass transistor. For a variety of NDR devices including RTDs, the current first increases with increasing applied voltage, reaching a peak value, then decreases with increasing applied voltage over a range of applied voltages, exhibiting negative differential resistance over this range of applied voltages and reaching a minimum ("valley") value. At yet higher applied voltages, the current again increases with increasing applied voltage. Thus, the current-vs.-voltage characteristic is shaped like the letter "N". A key figure of merit for NDR devices is the ratio of the peak current to the valley current (PVCR). The higher the value of the PVCR, the more useful the NDR device is for variety of circuit applications. The PVCR of RTDs is generally not high enough to make it practical for low-power SRAM application, because in order for the RTDs in a Goto cell to have sufficient current drive, the valley current is too large, causing large static power dissipation. In addition, RTDs require specialized fabrication process sequences so that the complexity of an integrated RTD/MOSFET SRAM process would be substantially higher than that of a conventional complementary MOS (CMOS) SRAM process, resulting in higher manufacturing cost.

METHOD OF MAKING MEMORY CELL UTILIZING NEGATIVE DIFFERENTIAL RESISTANCE DEVICES

CROSS REFERENCE TO RELATED APPLICATIONS

The present application claims priority to and is a divisional of application Ser. No. 10/185,568 filed Jun. 28, 2002, now U.S. Pat. No. 6,795,337 which is incorporated by reference herein.

FIELD OF THE INVENTION

This invention generally relates to semiconductor memory devices and technology, and in particular to two terminal NDR elements and static random access memory (SRAM) devices that utilize such elements.

BACKGROUND OF THE INVENTION

The rapid growth of the semiconductor industry over the past three decades has largely been enabled by continual advancements in manufacturing technology which have allowed the size of the transistor, the basic building block in integrated circuits (ICs), to be steadily reduced with each new generation of technology. As the transistor size is scaled down, the chip area required for a given circuit is reduced, so that more chips can be manufactured on a single silicon wafer substrate, resulting in lower manufacturing cost per chip; circuit operation speed also improves, because of reduced capacitance and higher transistor current density. State-of-the-art fabrication facilities presently manufacture ICs with minimum transistor lithographically defined feature size smaller than 100 nm, so that microprocessor products with transistor counts approaching 100 million transistors per chip can be manufactured cost-effectively. High-density semiconductor memory devices have already reached the gigabit scale, led by dynamic random access memory (DRAM) technology. The DRAM memory cell consists of a single pass transistor and a capacitor (1T/1C), wherein information is stored in the form of charge on the capacitor. Although the DRAM cell provides the most compact layout (with area ranging between $4F^2$ and $8F^2$, where F is the minimum feature size), it requires frequent refreshing (typically on the order of once per millisecond) because the charge on the capacitor leaks away at a rate of approximately $10^{-15}$ Amperes per cell. This problem is exacerbated by technology scaling, because the transistor leakage current increases with decreasing channel length, and also because a reduction in cell capacitance results in a smaller number of stored charge carriers, so that more frequent refreshing is necessary. Thus, scaling of DRAM technology to much higher densities presents significant technological challenges.

Static RAM (SRAM) does not require refreshing and is generally faster than DRAM (approaching 1 ns access times as compared to tens of ns for DRAM). However, the SRAM cell is more complex, requiring either four n-channel metal-oxide-semiconductor field-effect transistors (MOSFETs) and two p-channel MOSFETs, or four n-channel MOSFETs and two polycrystalline-silicon (poly-Si) load resistors, resulting in significantly larger cell size (typically greater than >120 $F^2$). Innovations which provide significant reductions in SRAM cell size while allowing the SRAM cell to retain its favorable operating characteristics are therefore highly desirable.

Negative differential resistance (NDR) devices have previously been proposed for compact static memory applica- Accordingly, there exists a significant need for NDR devices with very high (>$10^6$) PVCR which can be easily integrated into a conventional CMOS technology, for compact, low-power, low-cost SRAM.

A new type of SRAM device to achieve such functionality using Negative Differential Resistance Field Effect Transistors NDR FETs) is described in detail in a patent application Ser. No. 10/029,077 filed Dec. 21, 2001 by T J King and assigned to the present assignee, and published on May 9, 2002 as Publication No. 2002/0054502. The NDR FET structure, operation and method of making the same are discussed in detail in patent application Ser. No. 09/603,101 filed Jun. 22, 2000 by King et al., which is also assigned to the present assignee. Such details are also disclosed in a corresponding PCT application PCT/US01/19825 which was published as publication no. WO 01/99153 on Dec. 27, 2001. The above materials are hereby incorporated by reference.

Additional embodiments of such device are dearly advantageous for use in memory applications, particularly embedded memory.

SUMMARY OF THE INVENTION

An object of the present invention is to provide an improved type of negative differential resistance (NDR) element to complement the types of devices available for providing a negative differential resistance characteristic in a silicon based environment;

A further object of the present invention is to provide a static random access memory (SRAM) cell which utilizes such types of new NDR elements.

For achieving these objects, one aspect of the invention provides a two terminal negative differential resistance NDR) semiconductor device formed on a silicon-based substrate. The two terminal NDR device includes a first doped region; a second doped region; and a gate adapted for receiving a gate control signal. The gate includes a gate electrode coupled to the first doped region. A controllable conductance region coupled between the first and second doped regions, said controllable conductance region being configured such that when a first bias potential is applied to the gate electrode and a second bias potential is applied between the first doped region and second doped region, energetic carriers are generated. A portion of these energetic carriers are trapped by a dielectric layer located proximate to the gate and forming an interface with the controllable conductance region. The device is configured to trap a number of the energetic carriers at or near the interface preferably using low energy level traps. Accordingly, in such device, a number of energetic carriers that can be trapped in the dielectric layer can be controlled by adjusting the first bias potential and/or the second bias potential so that the two terminal NDR semiconductor device operates as a silicon-based NDR device.

In a preferred embodiment, the two terminal NDR semiconductor device is an NDR-capable field effect transistor (FET) which has a negative voltage threshold, and whose gate is coupled to a drain region formed in the silicon substrate. In this manner, the two terminal NDR semiconductor device operates essentially as an NDR diode.

Again, in a preferred embodiment, the controllable conductance region is a channel associated with the NDR capable FET, and which includes a first dopant that is of opposite type to a second dopant used in said first doped region and said second doped region. The charge trapping sites ate also preferably characterized by an energy level that is above the conduction band edge of said channel.

In one exemplary application, the two terminal NDR semiconductor device is used as a load element within a memory cell. In such case (and in other applications) the device is coupled to a three terminal NDR semiconductor device on a common silicon substrate, where the three terminal NDR semiconductor device includes an NDR-capable field effect transistor. Furthermore, in a related aspect, the dielectric layer is used for forming charge trapping regions for both the two terminal NDR semiconductor device and the three terminal NDR semiconductor device. Further in a preferred embodiment of such type the two terminal NDR semiconductor device and three terminal NDR semiconductor device include a first channel region and a second channel region, and are formed so that the second channel region includes a concentration of doping impurities that is substantially higher than the first channel region.

Further aspects of the present invention are directed to methods of making and operating the aforementioned two terminal NDR device.

Another aspect of the invention pertains to a memory device utilizing the aforementioned two terminal NDR device as a load element. This memory device comprises a transfer field effect transistor (FET) configured to receive and/or transfer a data value from a data line to a storage node in response to a write and/or read signal respectively provided to the memory cell; and a first negative differential resistance element, the first NDR element being in the form of an NDR-capable field effect transistor (FET) configured to receive a first gate bias signal and having a first NDR FET drain terminal coupled to the storage node, and a first NDR FET source terminal coupled to a first voltage potential at a first node; and a second negative differential resistance element, the second NDR element being a two terminal NDR-capable device configured so that a first terminal receives a second bias signal from a second voltage potential at a second node, and a second terminal is coupled to the storage node. In this fashion, the memory cell uses the negative differential resistance characteristic of the first NDR element and the second NDR element to store the data value at the storage node.

In a preferred embodiment, the first NDR element and the second NDR element are connected in series and are formed in a common substrate and with one or more common layers formed with the transfer FET.

In a preferred approach, the NDR element includes a second NDR FET that has a negative threshold voltage; however, in some embodiments, the second NDR element includes a silicon based tunneling diode. To achieve a diode like operation, the second NDR FET includes a channel doping that is substantially less than that of the first NDR FET. Further in a preferred embodiment, the first NDR element and second NDR element both use a charge trapping region that is located at an interface between an insulation layer and a substrate for each of the elements. However, in some applications, these elements use different types of charge trapping regions, such that a first charge trapping region is located within an insulation layer, while a second charge trapping region is located at an interface between such insulation layer and the substrate.

A method of operating and making the memory cell are also provided to achieve the above objects and others.

DETAILED DESCRIPTION OF THE INVENTION

Figure 1:
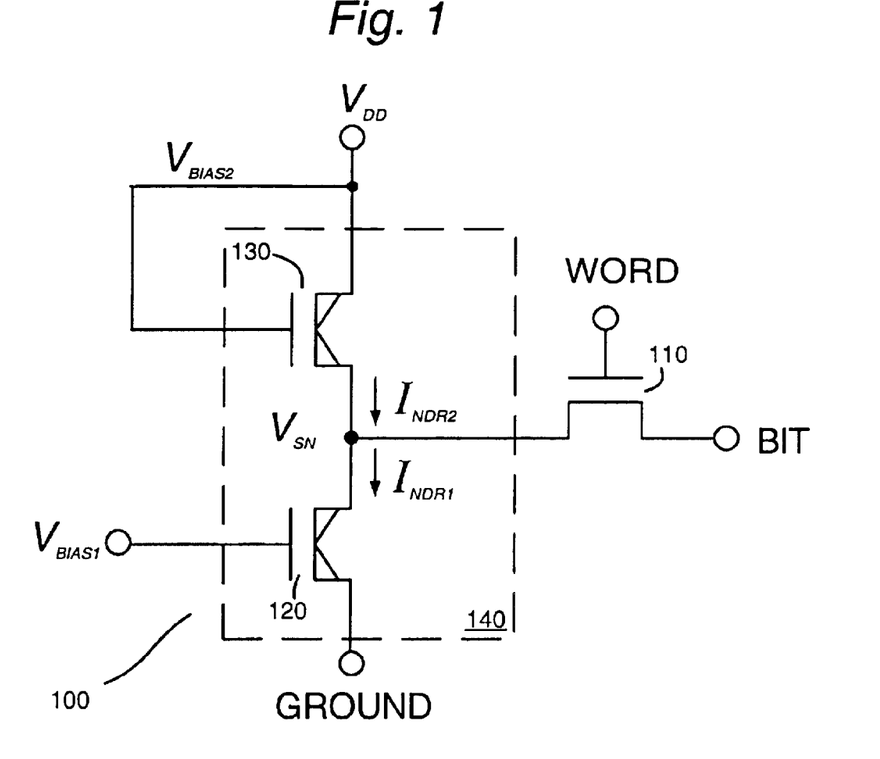
FIG. 1 is a circuit diagram of a static random access memory (SRAM) cell consisting of the combination of two NDR elements which form a bistable latch and one n-channel enhancement-mode IGFET access element, wherein at least one of the NDR elements is an NDR FET, and the other NDR element is an NDR FET configured to operate like an NDR diode.

A semiconductor device and memory cell according to preferred embodiments of the invention will now be described with reference to FIGS. 1 and 2. FIG. 1 is a circuit diagram of a preferred embodiment of a static memory (SRAM) cell 100 consisting of two NDR elements 120, 130 which form a bistable latch 140 and one enhancement-mode IGFET access element 110. As noted earlier, a preferred embodiment of the present invention uses a mixture of two terminal and three terminal NDR elements to form SRAM cell 100. In this respect, therefore, NDR element 120 is preferably an NDR FET, while NDR element 130 is preferably an NDR FET that is configured to operate like an NDR diode (i.e., as a two terminal NDR element).

Figure 2:
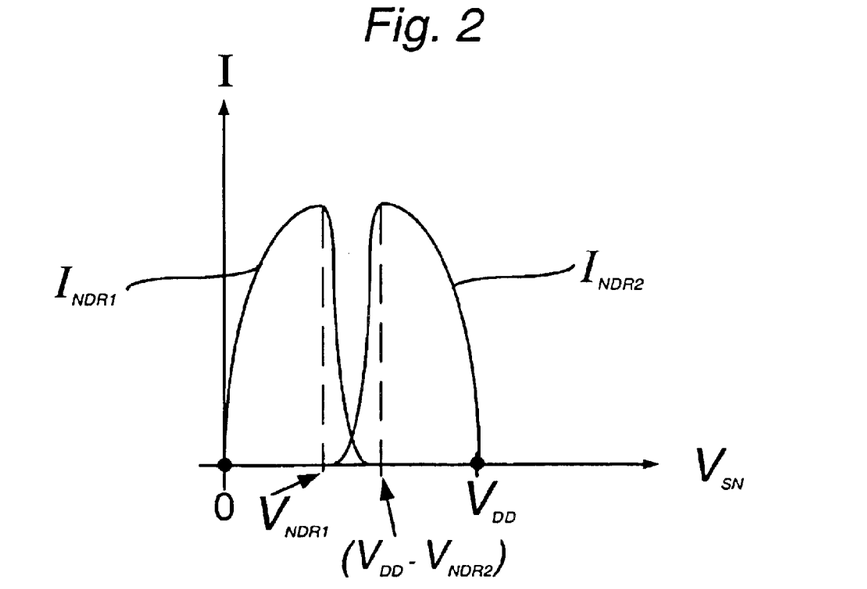
FIG. 2 is a plot of the current-vs.-voltage characteristic of the bistable latch formed by the combination of two NDR elements depicted in FIG. 1.

FIG. 2 is a current-vs.-voltage plot illustrating the operational characteristics of the static memory cell 100 of FIG. 1.

NDR element 120 of the present invention is preferably an NDR FET of the type referred to above in the aforementioned King et al. applications. The details of the same are provided for example in the aforementioned applications, and such documents are incorporated by reference herein primarily for the purpose of providing non-essential background information on representative types of environments in which the present inventions can be practiced. Other types of silicon based NDR FETs are clearly suitable and encompassed within the present teachings.

In contrast to NDR element 120, NDR element 130 of the present invention is preferably an NDR FET that has been configured to be operated as a two-terminal device. To achieve such functionality, the threshold voltage preferably should be negative.

This structure for NDR element 130 is made possible by doping the channel of an NDR FET more lightly (as compared to NDR FET element 120)—ie., in a preferred approach, with a net p-type concentration (preferably Boron) of less than $10^{16}/cm^3$ or thereabouts. Again, those skilled in the art will appreciate that the precise concentrations will vary in accordance with the geometry and other related processing parameters for any particular device.

The two terminal configuration of NDR element 130 is made possible by the fact that in very short channel (<100 nm) devices, the carrier velocity in the channel is high enough so that "warm" electrons are generated along a significant portion of the channel. Accordingly, a high level of doping is not needed. Thus, a type of NDR diode can be constructed from modified versions of basic NDR FET elements and employed as needed for particular applications, such as memory devices, and in those areas where its performance and characteristics are more suitable or desirable.

In the embodiment of FIG. 1, a preferred embodiment of an NDR element 130 is created by tieing a gate and drain tied together of an n-channel NDR-FET structure. As with the other embodiments, the charge traps are preferably located at or near the interface between the gate dielectric and the semiconductor channel. The traps are further configured with an energy level such that they only trap energetic electrons, i.e. it is above the conduction-band edge of the semiconductor channel.

It will be appreciated, of course, that such two terminal NDR element could be used in many other applications besides SRAM where it is desirable to exploit an NDR effect.

The other elements of SRAM cell 100 include an IGFET 110 is configured as a transfer gate, allowing a BIT line terminal to be connected to a storage node under the control of a WORD line terminal. One of the source/drain electrodes of IGFET 110 is connected to the storage node at potential $V_{SN}$, the other source/drain electrode of IGFET 110 is connected to the BIT line, and the gate electrode of IGFET 110 is connected to the WORD line. While it is not critical to the present invention, this IGFET 10 can be integrated optimally from a process perspective with NDR elements 120, 130 as described in the aforementioned King applications.

From a structural perspective, a source electrode of first NDR-FET 120 is connected to a ground terminal, a gate electrode of NDR element 120 is supplied with a first bias voltage $V_{BIAS1}$, a drain region of NDR element 120 is connected together with a source region of an NDR element 130 to the storage node. The gate electrode of NDR element 130 is tied directly to the drain electrode which is supplied with a positive voltage VDD.

The current flowing in first NDR element 120, $I_{NDR1}$, is dependent on the difference between its drain electrode potential and its source electrode potential $V_{SN}$, at first increasing rapidly as $V_{SN}$ increases, reaching a peak value when $V_{SN}$ is equal to a critical voltage $V_{NDR1}$, and rapidly decreasing to nearly zero as $V_{SN}$ increases beyond the critical voltage $V_{NDR1}$. The bias voltage $V_{BIAS1}$, is sufficiently high so as to ensure that first NDR-FET 120 is turned on for values of $V_{SN}$ ranging from 0 V (sound potential) to $V_{NDR1}$.

The current flowing in second NDR element—$I_{NDR2}$—is dependent on the difference between its drain and its source potential, $V_{DD}-V_{SN}$ at first increasing rapidly as $V_{DD}-V_{SN}$ increases, reaching a peak value when $V_{DD}-V_{SN}$ is equal to a critical voltage $V_{NDR2}$, and rapidly decreasing to nearly zero as $V_{DD}-V_{SN}$ increases beyond the critical voltage $V_{NDR2}$. As noted earlier, NDR element is an NDR FET configured to operate with a negative threshold, so a bias voltage applied to its gate is sufficiently high so as to ensure that it is turned on for values of $V_{DD}-V_{SN}$ ranging from 0 V (ground potential) to $V_{NR2}$.

Next the preferred operation of bistable latch 140 in SRAM cell 150 of FIG. 1 will be described. FIG. 2 shows the current-vs.-voltage (I-V) characteristic curve $I_{NDR1}$ of first NDR element 120 obtained by changing the storage node voltage $V_{SN}$ in a range between 0 and $V_{DD}$, superimposed with the I-V characteristic curve $I_{NDR2}$ of second NDR element 130. A stable operating point of circuit 140 is a point where the I-V characteristic curve $I_{NDR1}$ of the first NDR element crosses the I-V characteristic curve $I_{NDR2}$ of the second NDR element and additionally the characteristic curves $I_{NDR1}$ and $I_{NDR2}$ have different gradient signs (positive, negative, or zero). (A crossing point where both of the characteristic curves $I_{NDR1}$ and $I_{NDR2}$ have positive or negative gradient is not a stable operating point.)

Therefore it is understood that circuit 140 is stable when the potential $V_{SN}$ at the storage node is one of two values 0 and $V_{DD}$-Vt as shown in FIG. 2 (where Vt is a threshold voltage for NDR element 130 and is preferably very small, or negative). Accordingly, the circuit can be used as a bistable memory cell by applying a potential of one of the two values 0 and $V_{DD}$ to the control terminal as a write voltage. If the value of $V_{SN}$ increases slightly above that of a low voltage (i.e., 0 volts) stable operating point, current $I_{NDR1}$ flowing in first NDR-element 120 becomes higher than the current $I_{NDR2}$ flowing in second NDR element 130, causing the value of $V_{SN}$ to be decreased toward 0 V (ground potential), to restore it to that of the stable operating point. Thus first NDR element 120 serves as a "pull-down" device. If the value of $V_{SN}$ falls slightly below that of a stable high voltage (i.e., $V_{DD}-V_t$) operating point, the current $I_{NDR1}$ flowing in second NDR element 130 becomes higher than the current $I_{NDR1}$ flowing in first NDR element 120, causing the value of $V_{SN}$ to be increased toward $V_{DD}-V_t$ to restore it to that of the stable operating point. Thus second NDR element 130 serves as a "pull-up" device.

IGFET 110 is controlled by the WORD line as follows: when the WORD line potential is sufficiently high, IGFET 110 is turned on, connecting the BIT line to the storage node to allow data transfer (reading data from the storage node, or writing data to the storage node); when the WORD line potential is low, IGFET 110 is turned off, so that the storage node is electrically isolated from the BIT line. In this manner, a bistable latch 140 is realized with two series-connected NDR elements, and a compact static memory cell is obtained by integrating latch 140 with a IGFET pass transistor 110.

It should be noted that in order to achieve low standby current in the SRAM cell, the valley currents of the NDR elements are preferably minimized, while in order to achieve a fast read access time, the peak current of the NDR elements are preferably maximized. Since the NDR element peak current and valley current are controlled by a gate bias voltage applied to an NDR FET, it is possible to achieve a very low valley current by using a lower gate bias voltage when the SRAM cell is in storage mode to achieve low static power dissipation, and to achieve a very high peak current by using a higher gate bias voltage when the SRAM cell is in read mode to achieve fast access time. In this aspect, the PVCR can effectively be enhanced by more than one order of magnitude.

As previously stated, the bias voltage (in this case, Vdd) should be sufficiently high so as to ensure that second (pull-up) NDR element 130 is turned on for values of $V_{DD}-V_{SN}$ ranging from 0 V (ground potential) to $V_{NDR2}$. Accordingly, a gate bias to NDR element 130 (Vdd) is greater than or equal to $V_{DD}+V_T$, because $V_T$ is the threshold voltage of second NDR element 130, and is configured to be <0 volts (i.e., as a depletion mode type device).

As previously stated, the bias voltage $V_{BIAS1}$ should be sufficiently high so as to ensure that first (pull-down) NDR-FET 120 is turned on for values of $V_{SN}$ ranging from 0 V (ground potential) to $V_{NDR1}$. Thus, a separate power supply voltage or a boosted supply (such as that provided by a charge pump circuit) would be needed in some instances. It should be noted that the charge pump circuit would not consume much power, as it would only supply a high voltage, with negligible current. Alternatively, $V_{BIAS1}$ can be tied or coupled to $V_{DD}$ if desired to simplify the present architecture and/or to reduce constraints on the aforementioned charge pump circuit.

Figure 3:
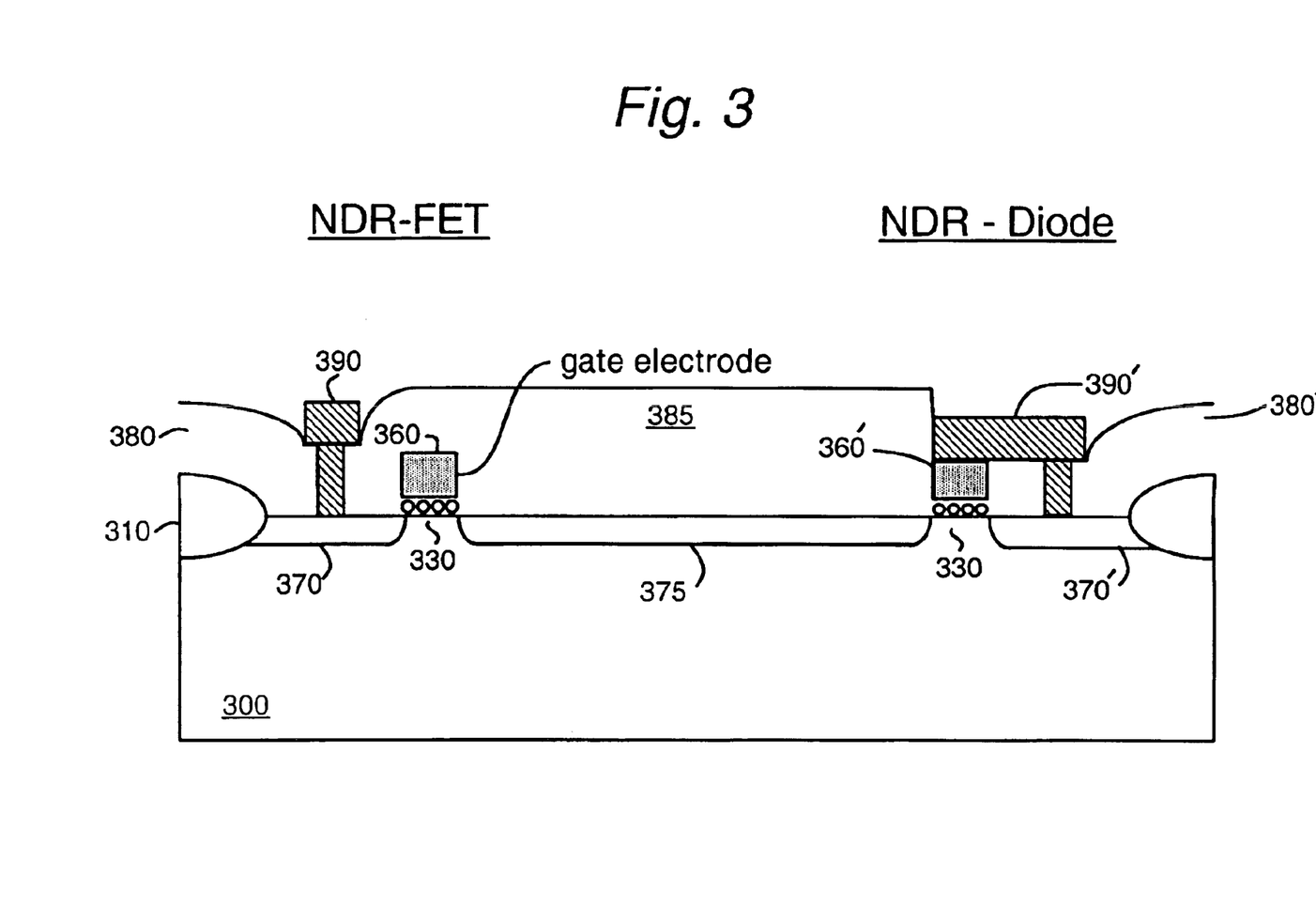
FIG. 3 is a schematic cross-sectional view of an NDR-FET element connected to an NDR Diode type element, showing the various layers shared by the two elements which are co-fabricated using a single process flow.

FIG. 3 is a schematic cross-sectional view of two NDR elements 120 and 130 such as would be formed in representative embodiments of the present invention (IGFET element 110 is not shown, but could also be formed with common processing steps as noted earlier). For example, a common substrate 300, a common isolation area 310 and common interlayer insulation layers 380 (380') are used by NDR elements 120 and 130 respectively. Furthermore, a single gate electrode layer is use for gates 360, 360' and a single metal/contact layer 390, 390'. As depicted in FIG. 3, a gate 360' of NDR element 130 is tied to a source/drain region contact 390' which is in turn coupled to Vdd. Source/drain regions 370, 370' are formed at the same time, and a common source/drain region 375 is shared by the NDR elements. This latter region can operate as a storage node for example in the above embodiments, and can also be shared by IGFET 110. An NDR charge trapping layer 330 is included within both NDR elements, for the reasons set forth in the aforementioned referenced applications.

It should be noted that the depiction in FIG. 3 is not intended to be to scale, or to show every conceivable topography, interconnect or layout for an NDR FET and NDR Diode. Most if not all of the structures, connections, layer thicknesses, spatial relationships spacings, etc., can be deviated and still fall within the scope of the present teachings.

In another variation, a charge trapping layer for NDR elements 120 and 130 are formed at different times, based on process convenience and/or performance characteristics required of such elements. In other words, it is conceivable that a first charge trapping region might be formed right at the interface for one of the NDR elements during a first processing operation, and a second charge trapping region might be formed further within a gate dielectric (or insulation layer above the channel/junction) for the other NDR element during a second processing operation. Other such variations will be apparent to those skilled in the art.

As shown therein, for process integration purposes, a two terminal (diode-type) NDR device and a three terminal (FET-type) NDR device are combined and could be manufactured within the same process, along with a pass transistor as well. To simplify such processing, channel implants are first performed at a light doping for both two terminal and three terminal NDR element regions 301 and 302. The two terminal NDR element channel regions (302) are then masked (with any conventional technique) during a subsequent heavier channel implant performed for three terminal elements. Conversely, the heavier implant can be performed for the three terminal type NDR elements while the two terminal type NDR elements are masked, followed by a removal of the mask and a second light doping performed everywhere (for both two terminal and three terminal elements). As these procedures are akin to what is conventionally performed for multiple-$V_t$ CMOS technologies, the specifics of the same for any process will be apparent to those skilled in the art without undue experimentation. Alternatively the two different types of channels could be counter-doped by varying amounts. Other methods for creating dual levels of channel implants, including through the use of spin-on diffusants, will be apparent as well from the present teachings.

Furthermore, for process integration purposes, it is apparent that the aforementioned two terminal and three terminal NDR elements, while preferably of the charge-trapping type noted above, need not be of the same type, or even use the same physical operational principle. Accordingly, a hybrid system of NDR elements, fabricated with conventional MOS/CMOS processing technologies, could be constructed of both tunneling and non-tunneling devices. This may be advantageous in certain applications where tunneling based devices present the most cost effective or optimal performance solution.

For instance, any other conventional NDR element that is adapted to be CMOS compatible (for example, a tunnel diode as shown in U.S. Pat. No. 6,294,412 which is incorporated by reference herein) and which requires a particular dopant implant step could be integrated with a three terminal implementation of the present invention, or two terminal implementation. For example, in the aforementioned U.S. Pat. No. 6,294,412, implants are required for a quantum well and the different p/n regions of the diode. One or more of such implant steps for a tunneling based NDR element could be performed at the same time a channel implant, or S/D implant is performed for an NDR FET (three terminal) or an NDR diode (two terminal) element. Other common and required processing steps (lithography/masking, insulation, heat treatments, interconnects) could be shared as well. Thus, it can be seen that the benefits of the present invention can be adapted for use with preexisting NDR technologies and in a cost-effective manner through integrated processing.

Finally, the present invention can also be implemented by a thin-body (fully depleted) silicon-on-insulator (S/D) structure employed for very short channel (<50 nm gate length) transistors. A FDSOI NDR-FET can have a slightly higher channel doping concentration (e.g. greater than $10^{16}/cm^3$) while having a negative threshold voltage, if a low-work-function gate material such as n-type poly-Si is used.

While the invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof) disclosed explicitly or implicitly to one of skill in the art, regardless of whether such relates to the claims as provided below, and whether or not it solves and/or mitigates all of the same technical problems described above. Finally, the applicants further reserve the tight to pursue new and/or additional claims directed to any such novel and non-obvious features during the prosecution of the present application (and/or any related applications).

What is claimed is:

1. A method of making a memory cell circuit comprising the steps of:

forming a transfer field effect transistor (FET) in a first region of a substrate so as to be connected in series between a data line and a storage node; and forming a first negative differential resistance (NDR) FET in a second region of said substrate so as to be connected in series between a first voltage potential and said storage node; and forming a second negative differential resistance (NDR) FET in a third region of said substrate so as to be connected in series between said storage node and a second voltage potential; and wherein said transfer FET and at least one of said first NDR FET or said second NDR FET share a common source/drain region, which common source/drain region operates as said storage node;

further wherein the transfer FET, said first NDR FET and said second NDR FET are formed in a common substrate.

2. The method of claim 1, further including a step of forming a charge trapping layer for said first NDR FET and said second NDR FET.

3. The method of claim 1, further including a step of forming a gate electrode layer, which gate electrode layer is shared by said transfer FET and at least one of said first NDR FET or said second NDR FET.

4. The method of claim 1, further including a step of forming a gate insulation layer, which gate insulation layer is by said transfer FET and both of said first NDR FET and said second NDR FET.

5. The method of claim 1, further including the steps of: forming a first charge trapping region for said first NDR element in a first location during a first processing operation; and forming a second charge trapping region for said second NDR element during a second separate processing operation.

6. The method of claim 1, further including a step of: doping a first channel region for said first NDR element with a first concentration during a first processing operation; and doping a second channel region for said second NDR element with a second concentration that is different from said first concentration during a second processing operation.

7. A method of making a memory cell circuit including a first negative differential resistance (NDR) device, a second NDR device, and a transfer field effect transistor (FET) comprising the steps of:

providing a common substrate for the transfer FET, the first NDR device and the second NDR device;

forming active regions in the common substrate for the transfer FET, the first NDR device and the second NDR device with one or more first common processing operations;

forming gate insulation regions over the common substrate for the transfer FET, the first NDR device and the second NDR device with one or more second common processing operations;

forming one or more gate electrodes over the gate insulation regions for the transfer FET, the first NDR device and the second NDR device using one or more third common processing operations;

wherein the transfer FET and at least one of the first NDR device or the second NDR device share a common active region, which common active region operates as a storage node.

8. The method of claim 7, wherein the first NDR device and/or second NDR device are field effect transistors adapted to exhibit an NDR behavior.

9. The method of claim 8, further including a step of: forming a separate trapping layer for the first NDR device and/or second NDR device.

10. The method of claim 7, wherein said active region is a source/drain region.

11. The method of claim 7, wherein said common substrate is a silicon on insulator (SOI) substrate.

12. The method of claim 7, further including a step of: connecting a gate electrode of the first NDR device and/or said second NDR device to an NDR bias control.

13. The method of claim 7, wherein the first NDR device, the second NDR device, and the transfer field effect transistor (FET) are manufactured using only complementary metal oxide semiconductor (CMOS) processing operations.

* * * * *